United States Patent [19]

Heyl et al.

[11] Patent Number: 5,357,214
[45] Date of Patent: Oct. 18, 1994

[54] METHODS AND APPARATUS FOR MICROPHONE PREAMPLIFICATION

[75] Inventors: Lawrence F. Heyl, Mountain View; Douglas M. Farrar, Los Altos, both of Calif.

[73] Assignee: Apple Computer, Inc., Cupertino, Calif.

[21] Appl. No.: 71,513

[22] Filed: Jun. 3, 1993

[51] Int. Cl.⁵ .............................................. H03F 21/00
[52] U.S. Cl. ..................................... 330/297; 381/121
[58] Field of Search ............... 330/297, 302, 303, 304, 330/305, 306; 381/122, 121, 120; 307/296.1

[56] References Cited

U.S. PATENT DOCUMENTS

| | | | |
|---|---|---|---|
| 3,296,546 | 1/1967 | Schneider | 330/303 |
| 5,053,720 | 10/1991 | Mizumoto | 330/297 |
| 5,281,906 | 1/1994 | Thelen | 307/296.1 |

FOREIGN PATENT DOCUMENTS 3730501 9/1987 Fed. Rep. of Germany ...... 330/297

OTHER PUBLICATIONS

Diers, Tracy, "Transistorized Preamp and Control Unit", Popular Electronics Sep. 1958 pp. 61–63.

Primary Examiner—Steven Mottola
Assistant Examiner—Tiep H. Nguyen
Attorney, Agent, or Firm—Judson D. Cary; Wayne P. Sobon

[57] ABSTRACT

Preamplifying circuitry amplifies sound signals for input into a computer system. A first stage common-emitter amplifier provides high-gain amplification of the input signal, while a second stage amplifier comprising an operational amplifier is suitable for driving a cable with the amplified sound signal. A low-cost constant voltage source comprising a diode and an operational amplifier supplies a voltage reference to both amplifier stages with a very high rejection of system noise. The circuitry and methods of the present invention provide a low-cost, easily manufactured preamplifier suitable for sound input in desktop computing devices.

6 Claims, 1 Drawing Sheet

METHODS AND APPARATUS FOR MICROPHONE PREAMPLIFICATION

FIELD OF THE INVENTION

The present invention relates to electronic amplifier systems. In particular the invention relates to preamplification of microphone signals in a computer system.

BACKGROUND OF THE INVENTION

With increasing sophistication, personal computers interact with users through a variety of multi-media apparatus and techniques. In particular, desktop computers have begun to include small, inexpensive microphones. These microphones allow a user to input sound and voice into computer applications. For instance, sampling program applications can capture, store and modify voice and music information. As another example, speech recognition and synthesis programs can parse human speech and perform program commands based upon the recognized human voice. New uses for sound inputs will continue to expand computer performance.

Unfortunately, several factors hamper the use of these microphones for sound input in desktop computers. The desktop computer, designed for digital purposes, presents a rather hostile environment for audio frequency electronic operation. Desktop computers continuously generate digital signals having spurious electromagnetic frequency components in the audio region. This audio-frequency noise can interfere with and degrade voice and sound signals. Exposed to this interference, program applications can exhibit anomalous and often erroneous behavior. Speech recognition applications, in particular, require fairly high signal-to-noise ratios to extract recognizable words from a stream of sound data. Audio frequency noise degradation can hamper and even prevent proper operation of these human voice and sound applications, especially from microphones that produce very low level signals. The most obvious solution to this problem would be to incorporate a very good amplifier within each desktop computer to adequately separate the sound input from any background audio-frequency noise, boosting sound signals to acceptable levels. However, the desktop computer industry is also subject to severe competitive pressures, requiring any solution for inputting sound data to be functional yet inexpensive. Conventional amplifiers that yield adequate signal-to-noise ratios with little added distortion are often complex to manufacture and too expensive to incorporate into desktop computer applications.

Current apparatus and methods for preamplification of microphone signals in computer systems do not provide a simple, inexpensive approach for amplifying sound inputs while minimizing noise degradation. These current approaches do not provide a high performance microphone preamplifier that is easy to manufacture, with high yields and dependable performance. What is needed is an improved method and apparatus for preamplification of microphone signals for computer applications. An improved apparatus and method for microphone preamplification should provide a simple, inexpensive and dependable approach for simple amplification of sound and human voice signals, while rejecting ambient noise from the desktop computer environment. The improved apparatus and method should provide a flexible approach that easily adapts to any particular desktop computer environment, and that can be incorporated in computer circuitry with inexpensive, readily available parts.

SUMMARY OF THE INVENTION

In accordance with the present invention, a microphone pre-amplifier system comprises a microphone input for accepting an electronic signal from a sound source; a voltage reference source; a common emitter amplifier coupled both to the microphone input and to the voltage reference source for high-gain amplification of the microphone/sound source signal; and a line driver amplifier coupled both to the output of the common emitter amplifier and to the voltage reference source for further amplification of the sound signal and for driving a high impedance/high capacitance output line.

To provide an inexpensive yet well-performing preamplification system, the present invention employs conventional dual operational amplifier (op-amp) circuits together with a single transistor. One op-amp couples to a diode voltage reference, and with appropriate feedback circuitry, amplifies the diode voltage reference, providing a stable, low-cost voltage reference for the remainder of the circuitry, with a high power supply noise rejection ratio. The transistor, preferably a bi-polar NPN transistor, provides a high-gain common emitter amplifier for the sound signal input. The output of the common emitter amplifier couples to an input of the other op-amp. This op-amp, through its feedback circuitry, operates as a voltage follower for DC signals, but is open loop for audio signals. The closed-loop gain of the entire preamplifier is set by injecting the output of the second op-amp back into the emitter of the transistor.

With only a few active components available off-the-shelf, the unique design of the preamplifier of the present invention provides inexpensive methods and apparatus for amplifying sound signals for use in a desktop computer, or in any other application requiring low-cost, high-performance sound amplification. The present invention can amplify, without significant distortion, the small electrical signals produced by typical microphone capsules to levels useful in desktop computer applications. The output signal of the present invention can be sent to an analog-to-digital converter, or directly to a recording or amplifying device, for any number of uses. These and other features and advantages of the present invention are apparent from the description below with reference to the following drawing.

DESCRIPTION OF THE PREFERRED EMBODIMENTS

Figure 1:
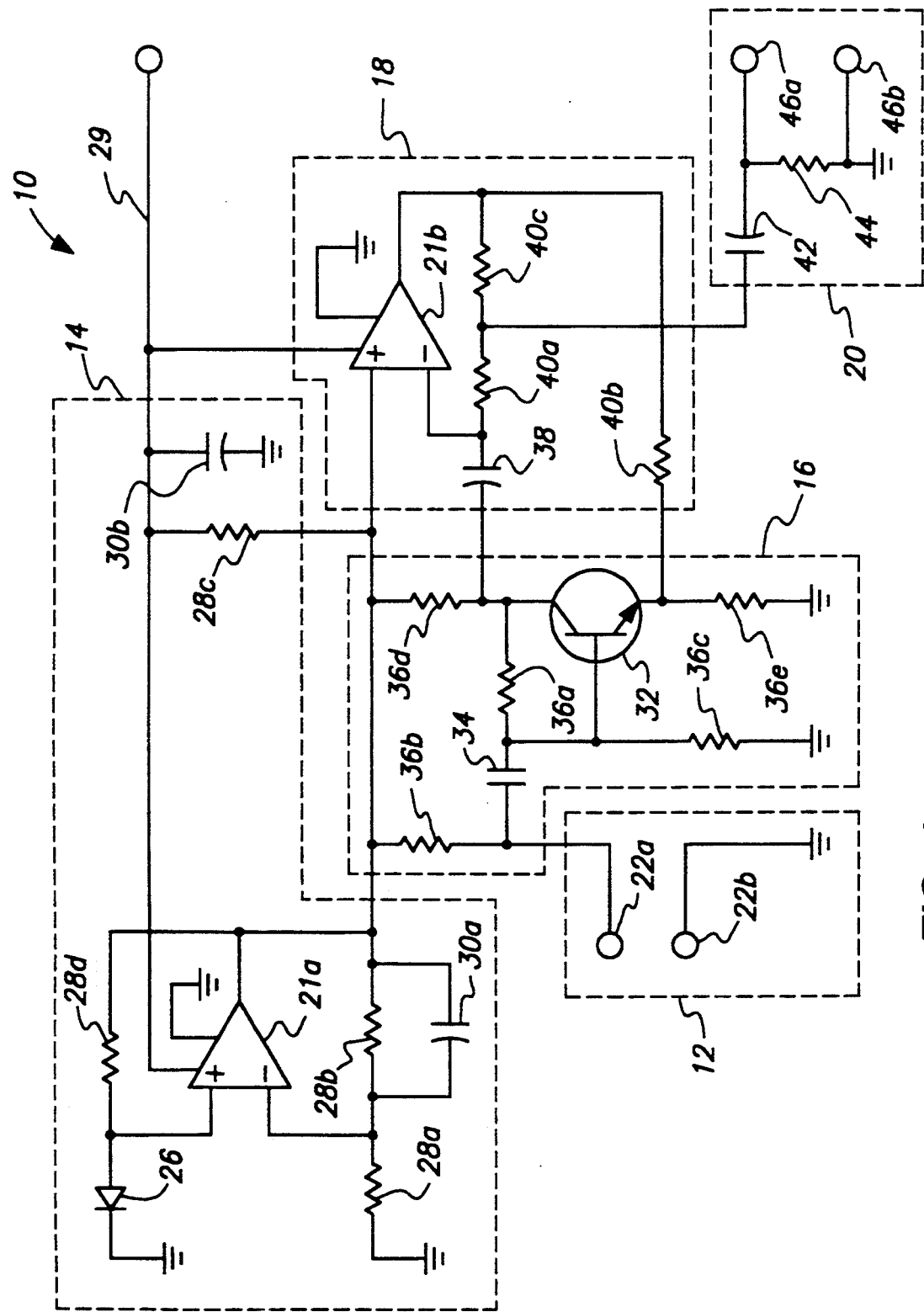
FIG. 1 shows a schematic diagram of a microphone preamplifier circuit in accordance with the present invention.

In accordance with the present invention, a microphone preamplifier circuit 10 is shown in FIG. 1. The microphone preamplifier circuit 10 comprises a microphone input 12, a voltage reference block 14, a common emitter amplifier block 16, a line driver amplifier block 18 and an output 20.

A microphone capsule attaches to input terminals 22a and 22b. The microphone capsule used in the preferred embodiment is an electric microphone capsule, commonly used in the art. The microphone capsule appears to preamplifier 10 as a JFET common drain amplifier. The connection at 22a is at the drain terminal of the microphone. Resistor 36b (2.2Kohm) establishes the drain characteristics specified by the capsule vendor. Since the microphone signal at 22a is only a few millivolts of audio signal, the input signal must be amplified by the preamplifier 10 to be useful for digital applications.

The voltage reference block 14 generates a well-defined, low-noise voltage reference of nominally +2.0 volts for use by preamplifier 10. Diode 26 (1N914) is biased to provide approximately 0.64 Vf at 25 degrees C. The change in the forward voltage Vf of diode 26, typically 2.2mV per degree C., is not compensated in the preferred embodiment, since this fluctuation is negligible over the expected temperature ranges for the preamplifier in usual desktop computer applications. The voltage of diode 26 is amplified by operational amplifier 21a (National Semiconductor LM358). Resistors 28a (27 Kohm) and 28b (56 Kohm) set the voltage gain of the reference, nominally at +3.0, yielding an output voltage reference of approximately 1.92 Volts. Capacitor 30a (2.2 µF) provides a single pole lowpass filter, attenuating any audio-band noise present at the voltage reference output. The low pass filter provided by capacitor 30a has a −3dB point of 2.7 Hz. Resistor 28c (56 Kohm), in conjunction with a 5 volt power input 29, provides an initial bias to the voltage reference 14 (that is, to diode 26) to assure that it starts. After the voltage reference 14 starts, resistor 28c is essentially out of the circuit. Capacitor 30b is a bypass capacitor to keep the impedance low between the input +5 Volt line and ground, to significantly attenuate noise inputs to the voltage reference 14 and to assure stable operation of the operational amplifier 21a. Voltage reference 14 provides a stable DC source with a powers supply rejection over the audio range of frequencies of nominally 100 dB.

The core of common emitter amplifier 16 is bi-polar NPN transistor 32 (2N3904). Capacitor 34 (0.047 µF) couples the input 22a of the microphone capsule to the base of transistor 32. Transistor 32 is operated as a high-gain common emitter amplifier. The distortion of common emitter amplifier 16 is reduced by the negative feedback provided by resistor 36a (56 Kohm). Resistors 36a (56 Kohm) and 36c (100 Kohm) set appropriate operating voltages for the base of transistor 32, while resistor 36d (2.2 Kohm) provides a collector load resistor for setting the output operating point of transistor 32. Resistor 36e (68 ohm) sets the open-loop gain of preamplifier 16 and provides modest negative feedback to enhance the operating stability of transistor 32. Resister 36e sets the overall gain of preamplifier 10, as discussed further below.

In line driver amplifier block 18, capacitor 38 (2.2 µF) couples the output of common emitter amplifier 16 (that is, from the collector of transistor 32) to the inverting input terminal of the second operational amplifier 21b. The voltage reference 14 connects to the other input of the operational amplifier 21b. Resistor 40a (1.1 Megohm) provides DC stability for operational amplifier 21b. Because of the high value of resistor 40a, operational amplifier 21b operates essentially open loop for audio signals, but as a stable voltage follower for DC signals. Capacitor 38 is selected large enough so that the time constant formed with resistor 40a does not disturb the closed-loop frequency response of the preamplifier 10.

Since transistor 32 has a very high gain bandwidth, the open loop response of transistor 32 in cascade with operational amplifier 21b is essentially that of op-amp 21b increased by the amount of gain provided by amplifier 16. The overall preamplifier circuit 10 closed loop gain is set by injecting feedback from the output of op-amp 21b into the emitter of transistor 32 through resistor 40b (2.2 Kohm). In the preferred embodiment, the closed loop gain is approximately the resistance of resistor 40b divided by that of resistor 36e (or 2200/68), yielding an approximate 30 dB gain. The noise performance of the entire preamplifier is largely determined by resistor 36e. The smaller resistor 36e is, the better the signal-to-noise ratio will be. This is so since resistor 36e is essentially the only internal noise source connected across the preamplifier input 22. Different values of resistors 40b and 36e can be chosen to provide different gain and noise performance for the amplifier. For example, with a value for resistor 36e of 22 ohms, the closed loop gain of the preamplifier 10 is 40 db, and the amplifier achieves a noise floor, over its −3 db bandwidth of 70 kHz, of −150dBV.

Resistors 40b and 36e also provide a significant load to the output of op-amp 21b. This load, nominally 2200 ohms, is sufficient to eliminate a crossover distortion that routinely appears with the National Semiconductor LM358 op-amp 21 when operated with too high a load impedance.

Resistor 40c decouples any shunt parasitic capacitance of an output cable attached to the preamplifier 10 from operational amplifier 21b, so that op-amp 21b will operate stably. Capacitor 42 (2.2 pF) and resistor 44 (56 Kohm) of the output block 20 provide DC decoupling from the audio signal. The low-frequency cut-off corner of capacitor 42 and resistor 44 was chosen to be much less than the cut-off set by capacitor 34. Outputs 46a and 46b provide the amplified audio signal delivered by preamplifier 10.

While the present invention has been described with reference to preferred embodiments, those skilled in the art will recognize that various modifications may be provided. A number of equivalent apparatus can be used to implement the present invention. For example, a PNP transistor could be used instead of the NPN of the preferred embodiment. Any number of equivalent components can be substituted for the operational amplifiers, diodes, capacitors and resistors. These and other variations upon and modifications to the described embodiments are provided for by the present invention, the scope of which is limited only by the following claims.

What is claimed is:

1. Apparatus for pre-amplification of an electronic signal from a microphone comprising:
    a microphone input for the electronic signal;
    a voltage reference source comprising
        a first operational amplifier having two inputs and an output,
        a diode coupled to a first input of the first operational amplifier, and
        a first capacitor coupled across an electrical connection from the output and a second input of the first operational amplifier;
    a common emitter amplifier coupled to the microphone input and the voltage reference source; and
    a line driver amplifier coupled to the common emitter amplifier and the voltage reference source, the line driver amplifier having an output for a pre-amplified electronic signal.

2. Apparatus for pre-amplification of an electronic signal from a microphone comprising:

a microphone input for the electronic signal;

a voltage reference source;

a first common emitter amplifier coupled to the microphone input and the voltage reference source; and a line driver amplifier coupled to the common emitter amplifier and the voltage reference source, the line driver amplifier having an output for a pre-amplified electronic signal, an operational amplifier, a capacitor coupled between the common emitter amplifier and an input of the operational amplifier, and a resistor coupled between the output of the operational amplifier and the emitter of the common emitter amplifier.

3. Apparatus for pre-amplification of an electronic signal from a microphone comprising:

a microphone input means for inputting the electronic signal;

a voltage reference means for providing a substantially constant voltage reference comprising wherein the voltage reference means comprises a first operational amplifier means for maintaining a feed-back amplification loop, the first operational amplifier means having two inputs and an output, a diode means for providing a low-voltage reference coupled to a first input of the first operational amplifier means, and a first capacitor coupled across an electrical connection from the output and a second input of the first operational amplifier means;

a common emitter amplifier means for high-gain amplification of the inputted electronic signal, the common emitter amplifier means coupled to the microphone input means and the voltage reference means; and a line driver amplifier means for driving a signal line, the line driver amplifier means coupled to the common emitter amplifier means and the voltage reference means, the line driver amplifier means having an output for a pre-amplified electronic signal.

4. Apparatus for pre-amplification of an electronic signal from a microphone comprising:

a microphone input means for inputting the electronic signal;

a voltage reference means for providing a substantially constant voltage reference;

a common emitter amplifier means for high-gain amplification of the inputted electronic signal, the common emitter amplifier means coupled to the microphone input means and the voltage reference means; and a line driver amplifier means for driving a signal line, the line driver amplifier means coupled to the common emitter amplifier means and the voltage reference means, the line driver amplifier means having an output for a pre-amplified electronic signal, an operational amplifier means for amplifying the amplified inputted electronic signal, a capacitor coupled between the common emitter amplifier means and an input of the operational amplifier means, and a resistor coupled between the output of the operational amplifier means and the emitter of the common emitter amplifier means.

5. A method for pre-amplification of an electronic signal from a microphone comprising:

inputting an electronic signal;

providing a voltage reference wherein the step of providing a voltage reference further comprises, maintaining a feed-back amplification loop using a first operational amplifier means, the first operational amplifier means having two inputs and an output, providing a low-voltage reference using a diode means coupled to a first input of the first operational amplifier means, and providing a feed-back loop using a first capacitor coupled across an electrical connection from the output and a second input of the first operational amplifier means;

high-gain amplifying the inputted electronic signal using a common emitter amplifier means coupled to the voltage reference; and driving a signal line using a line driver amplifier means, the line driver amplifier means coupled to the common emitter amplifier means and the voltage reference, the line driver amplifier means having an output for a pre-amplified electronic signal.

6. A method for pre-amplification of an electronic signal from a microphone comprising:

inputting an electronic signal;

providing a voltage reference;

high-gain amplifying the inputted electronic signal using a common emitter amplifier means coupled to the voltage reference; and driving a signal line using a line driver amplifier means, the line driver amplifier means coupled to the common emitter amplifier means and the voltage reference, the line driver amplifier means having an output for a pre-amplified electronic signal.

wherein the line driver amplifier means further comprises, an operational amplifier means for amplifying the amplified inputted electronic signal, a capacitor coupled between the common emitter amplifier means and an input of the operational amplifier means, and a resistor coupled between the output of the operational amplifier means and the emitter of the common emitter amplifier means.

* * * * *